United States Patent
Lane et al.

(10) Patent No.: US 7,064,442 B1
(45) Date of Patent: Jun. 20, 2006

(54) INTEGRATED CIRCUIT PACKAGE DEVICE

(75) Inventors: William A. Lane, Cork (IE); Mike A. O'Neill, Limerick (IE); John R. Reidy, Limerick (IE); Tom D. Moore, Limerick (IE); Nicola M. O'Byrne, Cork (IE); Leo P. McHugh, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 141 days.

(21) Appl. No.: 10/612,274

(22) Filed: Jul. 2, 2003

(51) Int. Cl.
*H01L 29/40* (2006.01)
(52) U.S. Cl. ..................... 257/773; 257/676
(58) Field of Classification Search ............... 361/268, 361/603, 620, 623, 836, 666–677; 257/666, 257/670, 676, 734, 773, 776
See application file for complete search history.

(56) References Cited

U.S. PATENT DOCUMENTS

| | | | |
|---|---|---|---|
| 4,286,225 A | 8/1981 | Morong, III | |
| 4,360,784 A | 11/1982 | Bartlett | |
| 4,780,795 A * | 10/1988 | Meinel | 361/765 |
| 5,754,088 A | 5/1998 | Fletcher et al. | |
| 6,215,816 B1 | 4/2001 | Gillespie et al. | |
| 6,249,171 B1 | 6/2001 | Yaklin et al. | |
| 6,287,893 B1 * | 9/2001 | Elenius et al. | 438/108 |
| 6,362,559 B1 * | 3/2002 | Boyd | 310/359 |
| 2003/0111660 A1 * | 6/2003 | Ghamaty et al. | 257/15 |
| 2004/0094835 A1 * | 5/2004 | Maghribi et al. | 257/734 |

OTHER PUBLICATIONS

"iCoupler Digital Isolator; ADuM1100", Analog Devices, Inc.—Product Datasheet, 2003; pp. 1-14.

* cited by examiner

*Primary Examiner*—Leonardo Andújar
(74) *Attorney, Agent, or Firm*—Wolf, Greenfield & Sacks, P.C.

(57) ABSTRACT

The invention relates to integrated circuit package devices including at least two component chips. In particular the invention describes such devices having a transformer provided between the two components chips, the transformer providing isolation between the component chips and wherein the total assembly is sufficiently small that it can be integrated in standard IC packages.

19 Claims, 3 Drawing Sheets ic Package Device

The invention relates to integrated circuit package devices including at least two component chips and, in particular, to such devices having a transformer provided between the two components chips, the total assembly being sufficiently small that it can be integrated in standard IC packages.

BACKGROUND TO THE INVENTION

Transformers have been used for many years to provide high voltage isolation for signals having radically different baselines, DC pedestals or other interfering low frequency artefacts. Such an isolation transformer is described in U.S. Pat. No. 6,249,171 and is used in U.S. Pat. No. 6,215,816 and applied further as an isolation amplifier in U.S. Pat. No. 4,286,225 and U.S. Pat. No. 4,360,784. Others have suggested that the coils of the transformer be integrated on or in the IC technology, such as the Analog Devices Adum1100 parts, or added into multi-layer PC boards or into hybrid modules, such as the now obsolete Analog Devices AD295 part. Problems associated with these approaches include size, reliability and application in high voltage environments.

FIG. 1 shows a multi-chip assembly 100 incorporating an embedded transformer 150 adapted to couple signals between a receiver chip 110 and a coil driver chip 120 according to the prior art. The two chips or dies are electrically connected to the lead frame 140 of the packaged device 100. The transformer 150 comprises two coils which are embedded in an insulating material 130 such as PCB material, as will be appreciated by those skilled in the art. These devices find application in situations where very high voltages (fixed or time varying) may be present and the designer desires to transfer low voltage signals out of this "hostile" environment into a well controlled voltage supply environment where, for example, digital signal processing can take place. In order to couple signals between these two environments, one common solution is to use coupling capacitors or discrete transformers or embedded transformers such as that shown in FIG. 1.

Alternative techniques use opto-electronic components as an interface between the two chips requiring a communication channel. These devices are based on a light signal transmitted from one side of the voltage divide to the other. Problems with such architectures include the power requirements of such opto-electronic components and the restriction in application to those possible using such technology.

There is therefore a need for an improved integrated package including two or more chips having a transformer interface provided therebetween.

SUMMARY OF THE INVENTION

Accordingly, the present invention provides an integrated package including two or more chips having a transformer interface provided therebetween. The transformer is desirably adapted to provide for a selective coupling or energy or signals between the two or more chips, the coupling being effected through the transformer, thereby ensuring isolation between the two or more chips.

According to a first embodiment of the present invention, a package device having a patterned lead frame with at least two isolated patterned dies or chips mounted thereon is provided, the package device additionally having a transformer component, individually mountable to the lead frame between the at least two patterned dies, the transformer adapted to provide for the selective coupling of energy between the two dies.

The selective coupling desirably effects a rejection of some of the unwanted energy components so as to provide for a blocking of predefined component signals from coupling between the isolated patterned dies.

Typically, these component signals may be high voltage components or signals.

The coupled energy may be in the form of a power signal, so that the coupling between the two dies is desirably used to provide or share power between the two dies.

The energy may be in the form of a communication signal, such that a coupling of the energy effects a transfer of information between the two dies.

In one embodiment, the transformer component may be formed as a planar transformer in a substrate, the substrate being mountable to the lead frame. In certain embodiments the substrate may be formed as a flexible substrate. In another embodiment, the transformer component may be a planar transformer formed using a wafer level fabrication technology such as is used for forming redistribution layers in bumped chips. In such an embodiment the transformer is typically fabricated on either a glass or silicon substrate which is then attached to the lead frame in a manner apparent to those skilled in the art.

In yet another embodiment, the transformer component is a discrete micro-miniaturised transformer which may be either a planar or non-planar transformer.

Desirably, the micro-miniaturised transformer is made using MEMS technology and may be either a planar or non-planar transformer.

The transformer component may be coupled directly onto heat sinks of the lead frame, thereby providing for a reduction of thermal impedance within the package device.

In the embodiment, where the substrate on which the transformer is formed is a flexible substrate, the flexible substrate is desirably a polyimide material, such as that provided by DuPont under the brand name "Kapton".

The invention also provides a transformer component including at least two individual transformers, thereby allowing for multiple channels of communication.

The invention also provides an integrated multi-chip package device comprising a first chip, a second chip and an isolating transformer component provided between the first and second chip, the first chip, the second chip and the transformer component being formed on segmented portions of a lead frame of the package device.

The invention also provides a method of isolating components provided on a packaged multi-die device, the method comprising the steps of:

providing a patterned lead frame, mounting on the lead frame a plurality of patterned dies, and coupling energy between at least two of the patterned dies via an isolating transformer, the isolating transformer being provided on a separate component within the package to the dies being coupled.

These and other features of the present invention will be better understood with reference to the following drawings.

DETAILED DESCRIPTION OF THE DRAWINGS

Figure 1:
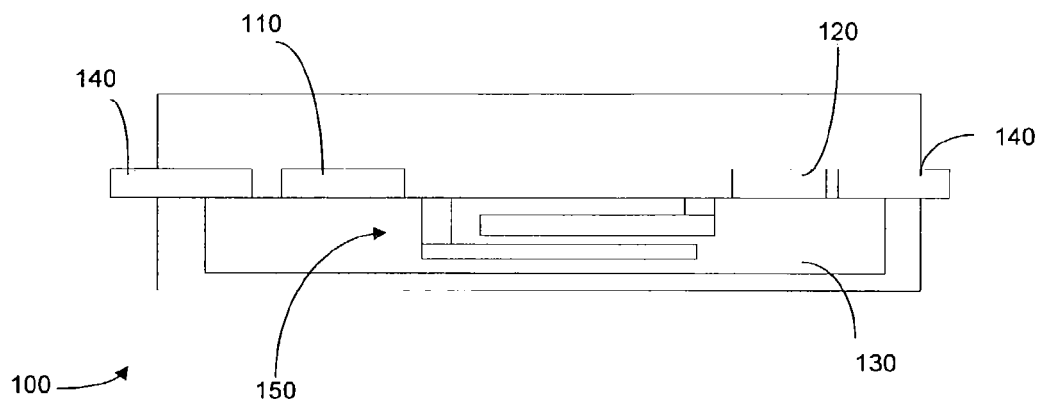
FIG. 1 shows a multi-chip module according to the prior art.

FIG. 1 has been described with reference to the prior art.

Figure 2:
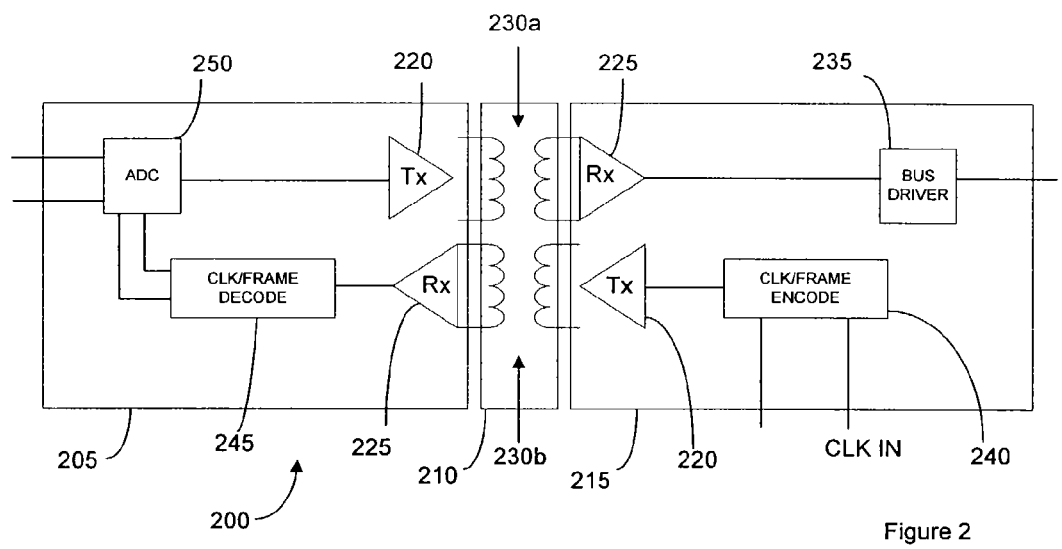
FIG. 2 shows in schematic block form an isolated analog-to-digital converter (ADC) adapted for bi-directional communication according to the present invention.

FIG. 2 shows in schematic form a block diagram of an isolated analog-to-digital converter 200 providing for bi-directional communication between two isolated dies 205, 215 according to the present invention. In this example of bi-directional communication, two channels 230a, 230b are provided, one channel for each direction of communication. Each of the channels is provided with a transformer coupling (230a, 230b, respectively) which is desirably manufactured in a planar fashion. The transformers are provided in a third block 210 of the converter, thereby isolating components formed on each of the first and second dies 205, 215. Each of the transformers is electrically connected to transmission 220 and receiving 225 components formed on the respective first and second dies 205, 215. In this exemplary embodiment an analog-to-digital converter (ADC) 250 and clock (clk)/frame decode 245 modules are formed on a first die 205, whereas a bus driver 235 and clk/frame encode module 240 are provided on the second die 215.

The transformers 230a, 230b as provided on the third die 210 provide for a coupling of signals between the first and second dies, yet maintains the ADC 250 on the first die 205 in galvanic (DC) isolation from the components provided on the second die 215.

Desirably the transformers are formed using materials such as a polyimide-based flexible substrate of the type manufactured and sold by DuPont under the trade mark "Kapton". Copper tracks may be laid onto the substrate materials directly and insulating overlay films are provided on both upper and lower surfaces of the material.

In order to effect a suitable miniaturization of the transformer components, it will be appreciated that other fabrication techniques such as MEMS 3D fabrication could be used. What is important is the physical size of a component which is able to withstand the voltage standoff requirements of such devices. This, it will be appreciated, may typically be achievable using some variation of planar coils, either using polyimide fabrication techniques or recently developed wafer-level thin film fabrication techniques. However, it may also be achievable by using a discrete wirewound transformer of a sufficiently small area. It will be appreciated that the present invention is intended to encompass any technique that may be utilized to provide such functionality.

It will also be appreciated that single or multiple transformers may be provided, thereby allowing for multiple channels of communication.

Figure 3:
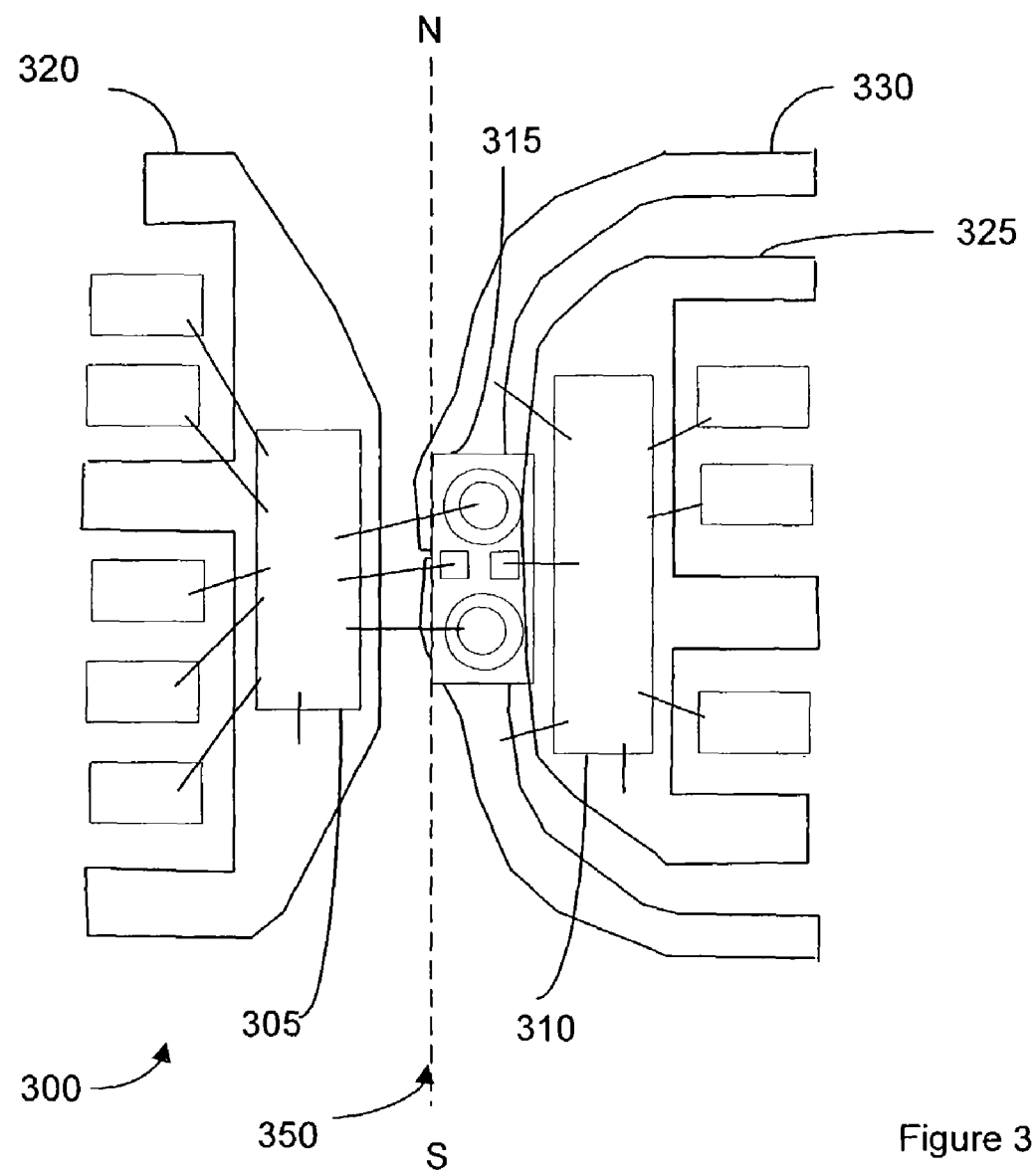
FIG. 3 shows an isolated ADC utilizing two transformers according to a first illustrative configuration according to the present invention.

The present invention provides for the combination of chips of different process technologies with an isolation transformer in a single molded package mounted on a patterned lead frame. Such an implementation with a lead frame 300 and an isolating ADC being provided by using two planar transformers is shown in FIG. 3. The lead frame 300 is split along a voltage divide (i.e., isolation barrier), shown as the N-S axis 350, and is patterned to accommodate the various internal connections that are required between a transformer block 315 and integrated circuits 305, 310 provided on either side of the voltage divide. The split lead frame provides for the mounting of each of the ICs 305, 310 and the transformer set 315 on respective individual components 320, 325, 330, respectively. Communication between the components provided on the first 320 and second 325 portions of the lead frame is effected through the transformer set 315. It is therefore possible to control the type of signal that may be coupled therethrough, thereby protecting or isolating components or circuitry on various dies on each of the portions of the lead frame 300.

Figure 4:
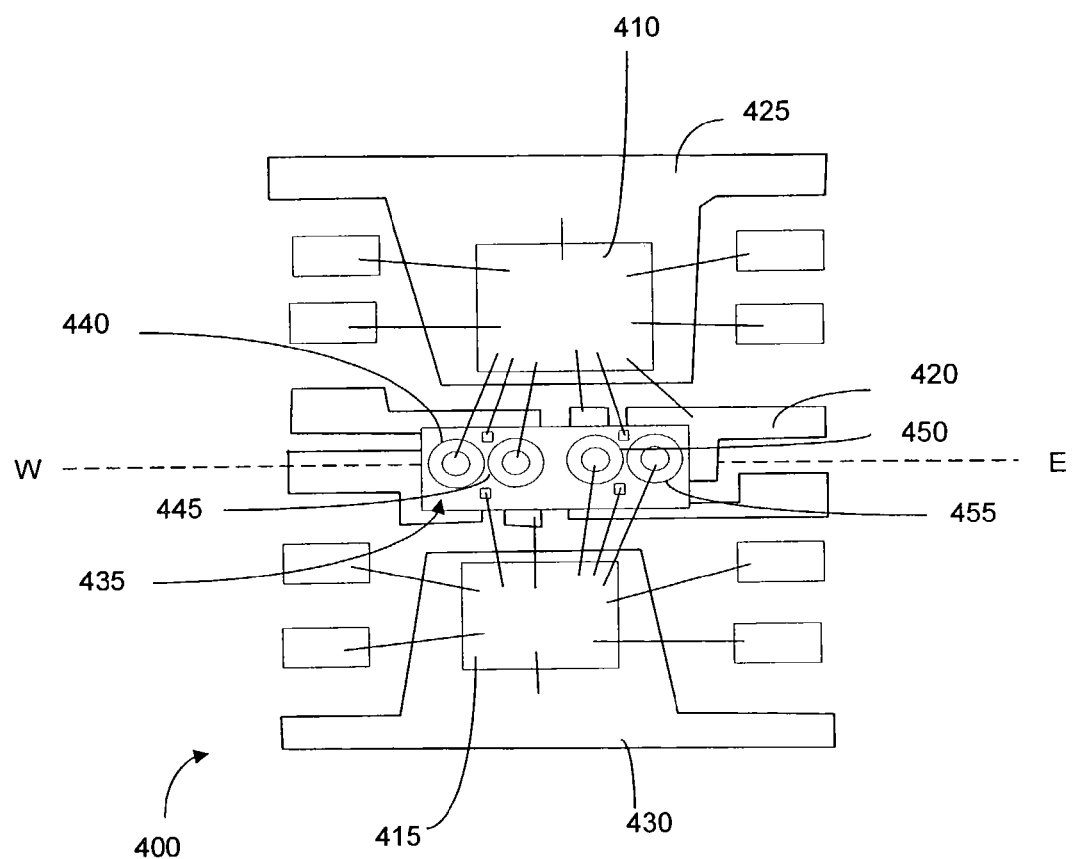
FIG. 4 shows an isolated ADC utilizing four transformers according to a second illustrative configuration according to the present invention.

FIG. 4 shows an alternative east-west configuration that may also be used. In this configuration, the lead frame 400 is separated along an east-west voltage divide axis, with individual dies 410 and 415 being connected to respective segments 425, 430 of the segmented lead frame 400. In the example of this east-west configuration, four transformers 440, 445, 450, 455 are used on a transformer block 435 mounted on a portion 420 of the lead frame.

It will be appreciated that in certain high voltage applications the north-south configuration is more desirable as it provides for a higher physical voltage separation, thereby minimizing the possibility of arcing, than is possible using an east-west configuration. It will be further understood that the terms "north-south", or "east-west" is not intended to be limited to a geographical orientation, but rather refers to a layout within the packaged device. In the "north-south" configuration, the coupling of signals across the dies via the transformer is in a direction substantially perpendicular to an axis defined by the legs of the lead frame whereas in the "east-west" configuration it is in a direction substantially parallel to the axis of the legs of the lead frame.

It will be further appreciated that while the present invention readily provides for the coupling of digital data across the isolating transformers in the form of pulses, that analog isolation can also be achieved using alternative sophisticated modulation schemes specifically adapted to enable a transfer of amplitude or other analog information.

It will be appreciated that components of the multi-die package may be adapted to be capable of assembly in a traditional assembly environment with connections between related circuitry being provided by wire bonds, chip bumping or the like.

It will be understood that although the present invention has been described with reference to the transfer of data signals between individual dies, that it is equally possible to transfer power between component dies of a multi-die device using the arrangement of the present invention. Such a transfer is particularly advantageous where the power supply is provided to a die operating in a high pedestal voltage environment and the power is being supplied from components operating in a low voltage environment, for example a digital environment.

It will be further appreciated that the present invention provides for individual transformer sets to be used for the transfer of information while other separate transformer sets are used for transferring power between components formed on separate dies. In such examples, a plurality of isolating transformers may be provided, each transformer adapted to provide for the coupling of a different type of energy (i.e., power or information).

The provision of a multi-packaged device according to the invention can provide for high voltage isolation between components provided on different dies within the packaged device. The invention also enables the provision of a mixed signal (e.g. an ADC or amplifier) circuit which has a technology solution small enough to go into standard IC packages, and which can achieve the required high voltage standoff capability.

This is provided, in preferred embodiments of the invention, by a package that incorporates at least two linear and/or mixed signal chips, one or more planar transformers or ultra-miniaturized transformers (for example transformers fabricated using MEMS technology) which are adapted to withstand the high voltage isolation conditions, while still meeting the signal transfer requirements. The implementation of the present invention is advantageous over prior art techniques to achieve voltage isolation in many ways including but not limited to, the following:

1) Compared to discrete miniature transformers, the planar configuration devices are smaller and cheaper with acceptable levels of performance. As previously mentioned however, discrete (e.g. wire-wound) miniature transformers could in principle also be used if sufficient space were available in the package.
2) Compared to on-chip transformers (e.g. copper plated transformer coils using a MEMS process), the technologies are more flexible and independent of the process used to make the IC's.
3) Higher isolation voltages are also more easily achieved using the materials of the preferred embodiment of the present invention as compared to standard PCB materials or the "wire wound" transformers, due to the high breakdown voltage of polyimide type films such those using Kapton™ type materials and their reproducibility in high volume flex manufacturing.
4) Compared to capacitive isolation, for example such as that disclosed in U.S. Pat. No. 4,292,595, the techniques of the present invention offer greater protection from dV/dt errors being introduced. This arises as dV/dt triggering is itself capacitively coupled, so that improving signal transfer means poorer immunity from capacitively coupled events.
5) Compared to optical isolation, which is the industry standard method, this approach offers improved power and speed advantages and a greater degree of integration of components.

It will be appreciated therefore that the present invention has been described with reference to exemplary embodiments which offer many advantages over the prior art methodologies. Although the invention has been described with reference to specific embodiments it is not intended to limit the application of the invention in any way except as may be deemed necessary in the light of the accompanying claims.

What is claimed is:

1. A package device having a patterned lead frame with at least two isolated patterned dies mounted thereon, the package device additionally having a planar transformer component, the planar transformer component comprising at least two planar transformers, each being individually mounted to the lead frame between the at least two patterned dies, the transformers adapted to provide for the selective coupling of energy between the two dies.

2. The device as claimed in claim 1 wherein the selective coupling effects a rejection of some of the unwanted energy components so as to provide for a blocking of predefined component signals from coupling between the isolated patterned dies.

3. The device as claimed in claim 1 wherein the coupled energy is in the form of a power signal such that the coupling between the two dies is used to provide or share power between the two dies.

4. The device as claimed in claim 1 wherein the coupled energy is in the form of a communication signal such that a coupling of the energy effects a transfer of information between the two dies.

5. The device as claimed in claim 1 wherein the transformer component is formed as a planar transformer in a substrate, the substrate being mounted to the lead frame.

6. The device as claimed in claim 1 wherein the transformer component is a planar transformer and is formed using wafer level fabrication technology such as is used for forming redistribution layers in bumped chips.

7. The device as claimed in claim 6 wherein the transformer is fabricated on either a glass or silicon substrate which is then mounted to the lead frame.

8. The device as claimed in claim 1 wherein the transformer component is a discrete micro-miniaturized transformer.

9. The device as claimed in claim 8 wherein the micro-miniaturised transformer is fabricated using MEMS technology.

10. The device as claimed in claim 1 wherein the transformer component is coupled directly onto heat sinks of the lead frame, thereby providing for a reduction of thermal impedance within the package device.

11. The device as claimed in claim 1 wherein the substrate on which the transformer is formed is a flexible substrate.

12. The device as claimed in claim 11 wherein the flexible substrate is made from a polyimide material.

13. The device as claimed in any of claims 12 wherein legs of the lead frame define an axis and the selective coupling of energy will, when it occurs, occur in a direction perpendicular to said axis.

14. The device as claimed in any of claims 12 wherein legs of the lead frame define an axis and the selective coupling of energy will, when it occurs, occur in a direction parallel to said axis.

15. The device of claim 1 wherein the transformers provide multiple channels of communication between the dies.

16. An integrated multi-chip package device comprising a first chip, a second chip and a planar isolating transformer component provided between the first and second chip, the first chip, the second chip and the planar transformer component being formed of two planar transformers on segmented portions of the lead frame of the package device.

17. The package device as claimed in claim 16 wherein the coupling of signals across the first and second chips via the transformer component is configured in a north-south configuration.

18. The package device as claimed in claim 16 wherein the coupling of signals across the first and second chips via the transformer component is configured in an east-west configuration.

19. A method of isolating components provided on a packaged multi-die device, the method comprising the steps of:
a) providing a patterned lead frame,
b) mounting on the lead frame a plurality of patterned dies, and
c) coupling energy between at least two of the patterned dies via at least two planar isolating transformers, the planar isolating transformers being provided on a separate component within the package to the dies being coupled.

* * * * *